(12) United States Patent
Kitazume et al.

(10) Patent No.: US 10,186,503 B2
(45) Date of Patent: Jan. 22, 2019

(54) MODULE AND MANUFACTURING METHOD THEREOF

(71) Applicants: Makoto Kitazume, Tokyo (JP); Toshiki Komiyama, Tokyo (JP)

(72) Inventors: Makoto Kitazume, Tokyo (JP); Toshiki Komiyama, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/739,260

(22) PCT Filed: Jul. 14, 2016

(86) PCT No.: PCT/JP2016/070795
§ 371 (c)(1),
(2) Date: Dec. 22, 2017

(87) PCT Pub. No.: WO2017/038264
PCT Pub. Date: Mar. 9, 2017

(65) Prior Publication Data
US 2018/0190637 A1    Jul. 5, 2018

(30) Foreign Application Priority Data
Aug. 28, 2015  (JP) .................................. 2015-169523

(51) Int. Cl.
*H01L 23/31*    (2006.01)
*H01L 25/18*    (2006.01)
(Continued)

(52) U.S. Cl.
CPC ........ *H01L 25/18* (2013.01); *H01L 23/49816* (2013.01); *H01L 24/17* (2013.01);
(Continued)

(58) Field of Classification Search
CPC ..... H01L 23/31; H01L 23/5386; H01L 24/14; H01L 25/162
(Continued)

(56) References Cited

U.S. PATENT DOCUMENTS 8,778,738 B1 * 7/2014 Lin .................. H01L 23/49838
                                                         438/118
9,917,063 B2 * 3/2018 Kim ..................... H01L 23/562
(Continued)

FOREIGN PATENT DOCUMENTS

| JP | 2003-007910 | 1/2003 |
|----|-------------|--------|
| JP | 2003-258192 | 9/2003 |
| JP | 5605222     | 10/2014 |

OTHER PUBLICATIONS

International Search Report for PCT/JP2016/070795 dated Sep. 6, 2016.

*Primary Examiner* — George Fourson, III
(74) *Attorney, Agent, or Firm* — IPUSA, PLLC

(57) ABSTRACT

The module is implemented on a circuit board, the module including a wiring board; an electronic component implemented on a first surface of the wiring board; an external connection electrode formed on a second surface of the wiring board; a solder bump connected to the external connection electrode; a bare chip implemented facedown on the second surface of the wiring board; and a resin covering a surface and a side surface of the bare chip and a side surface of the solder bump on the second surface of the wiring board, wherein a reverse surface of the bare chip and a connection surface of the solder bump are exposed from the resin such that the reverse surface of the bare chip and the connection surface of the solder bump are on a same plane, and wherein the module is implemented on the circuit
(Continued)

board so that the reverse surface of the bare chip and the connection surface of the solder bump face the circuit board.

6 Claims, 7 Drawing Sheets

(51) Int. Cl.
    *H01L 23/498*     (2006.01)
    *H01L 25/065*     (2006.01)
    *H05K 3/40*     (2006.01)
    *H01L 23/538*     (2006.01)
    *H01L 25/16*     (2006.01)
    *H01L 23/00*     (2006.01)
    *H01L 25/00*     (2006.01)
    *H05K 3/28*     (2006.01)

(52) U.S. Cl.
CPC ....... *H01L 25/0657* (2013.01); *H05K 3/4007* (2013.01); *H01L 23/31* (2013.01); *H01L 23/5386* (2013.01); *H01L 24/14* (2013.01); *H01L 25/162* (2013.01); *H01L 25/50* (2013.01); *H01L 2224/131* (2013.01); *H01L 2224/13144* (2013.01); *H01L 2224/16227* (2013.01); *H01L 2224/32225* (2013.01); *H01L 2224/73204* (2013.01); *H01L 2224/73253* (2013.01); *H01L 2224/81815* (2013.01); *H01L 2224/92125* (2013.01); *H01L 2224/97* (2013.01); *H01L 2225/06517* (2013.01); *H01L 2225/06572* (2013.01); *H01L 2924/15311* (2013.01); *H01L 2924/15787* (2013.01); *H01L 2924/15791* (2013.01); *H01L 2924/181* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01); *H05K 3/284* (2013.01); *H05K 2201/10674* (2013.01); *H05K 2203/025* (2013.01)

(58) Field of Classification Search
USPC .......................................... 257/778; 438/108
See application file for complete search history.

(56) References Cited

U.S. PATENT DOCUMENTS

| | | | |
|---|---|---|---|
| 2003/0165052 A1* | 9/2003 | Negishi | H01L 23/36 361/783 |
| 2004/0036164 A1* | 2/2004 | Koike | H01B 1/22 257/723 |
| 2011/0062584 A1 | 3/2011 | Ishihara | |
| 2011/0156250 A1* | 6/2011 | Goh | H01L 25/16 257/738 |
| 2013/0105973 A1* | 5/2013 | Gan | H01L 23/3121 257/738 |
| 2014/0131896 A1* | 5/2014 | Yu | H01L 23/49816 257/782 |
| 2016/0027753 A1* | 1/2016 | Jeon | H01L 24/97 257/737 |
| 2018/0019195 A1* | 1/2018 | Lee | H01L 25/50 |
| 2018/0047687 A1* | 2/2018 | Kim | H01L 21/563 |

* cited by examiner

MODULE AND MANUFACTURING METHOD THEREOF

TECHNICAL FIELD

The present invention relates to a module and a manufacturing method thereof.

BACKGROUND ART

A module has been known such that electronic components are implemented on both sides of a wiring board, respectively. For example, there is a module that is provided with, on each side of a wiring board, a connecting pad for connecting an electronic component and a wiring pattern for connecting these, and that is provided with a through wiring part for connecting the connecting pad and the wiring pattern on one of the sides with the connecting pad and the wiring pattern on the other side with each other. This module is provided with a post electrode for external connection on a reverse side of the wiring board (cf. Patent Document 1, for example).

PRIOR ART DOCUMENTS

Patent Documents

Patent Document 1: Japanese Patent Number 5605222

SUMMARY OF THE INVENTION

Problem to be Solved by the Invention

In the above-described structure, however, the height of the post electrode is greater than that of the electronic component implemented on the reverse side of the wiring board, and the module may not be made thinner.

The present invention is achieved in view of the above-described point, and an object is to provide a module that can be made thinner.

Means for Solving the Problem

The module (1) is implemented on a circuit board (100), the module including a wiring board (10); an electronic component (20) implemented on a first surface (10a) of the wiring board (10); an external connection electrode (4) formed on a second surface (10b) of the wiring board (10); a solder bump (50) connected to the external connection electrode (40); a bare chip (30) implemented facedown on the second surface (10b) of the wiring board (10); and a resin (94) covering a surface and a side surface of the bare chip (30) and a side surface of the solder bump (50) on the second surface (10b) of the wiring board (10), wherein it is required that a reverse surface of the bare chip (30) and a connection surface of the solder bump (50) are exposed from the resin (94) such that the reverse surface of the bare chip (30) and the connection surface of the solder bump (50) are on a same plane, and that the module (1) is implemented on the circuit board (100) so that the reverse surface of the bare chip (30) and the connection surface of the solder bump (50) face the circuit board (100).

Note that the reference numerals in the above-described parentheses are attached to facilitate understanding, these are merely examples, and the depicted embodiments are not for limiting.

Advantageous Effect of the Invention

According to a disclosed technique, a module that can be made thinner can be provided.

EMBODIMENTS FOR IMPLEMENTING THE INVENTION

Figure 1:
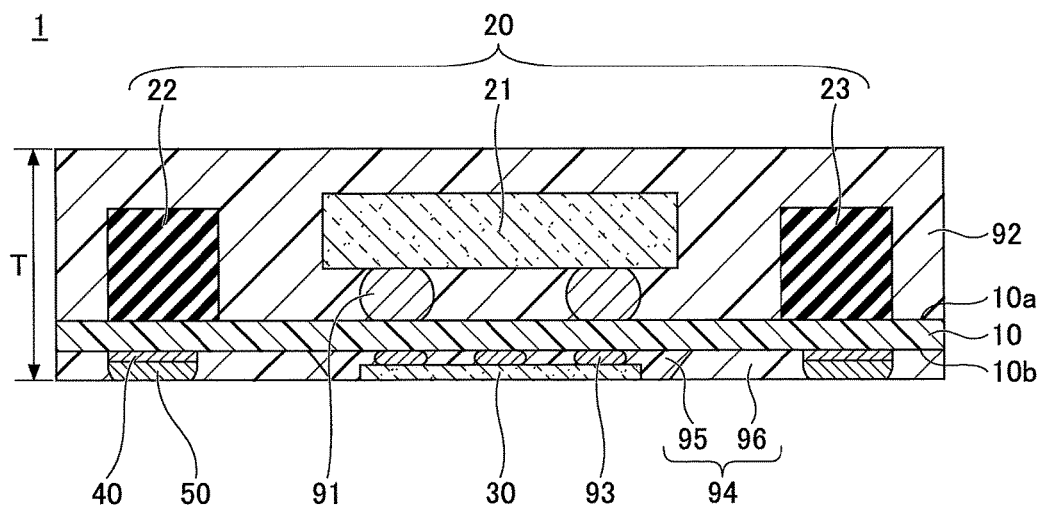
FIG. 1 is a cross-sectional view exemplifying a module according to a first embodiment.

In the following, an embodiment for implementing the present invention is described by referring the drawings. In the drawings, the same reference numerals may be attached to the same components, respectively, and duplicate descriptions may be omitted.

First Embodiment

FIG. 1 is a cross-sectional view exemplifying a module according to a first embodiment. Referring to FIG. 1, the module 1 according to the first embodiment includes a wiring board 10; an electronic component 20; a bare chip 30; an external connection electrode 40; and a solder bump 50. The thickness T of the module 1 may be approximately from 500 μm to 800 μm, for example. In the following, each of the components is described.

The wiring board 10 is a part that is to be a substrate on which the electronic component 20, etc., is to be implemented; and, for example, a glass epoxy substrate may be used that is obtained by impregnating a glass cloth with an insulating resin, such as an epoxy resin. As the wiring board 10, for example, a ceramic substrate, a silicone substrate, and so forth may be used. Further, the wiring board 10 may be a multilayer wiring board, such as a build-up substrate.

The thickness of the wiring board 10 may be approximately from 100 μm to 300 μm, for example.

The electronic component 20 includes a semiconductor integrated circuit 21; and external parts 22 and 23 of the semiconductor integrated circuit 21. For example, the semiconductor integrated circuit 21 is flip-chip implemented facedown on the first surface 10a of the wiring board 10 through a solder bump 91. The external parts 22 and 23 are implemented on the first surface 10a of the wiring board 10 in the vicinity of the semiconductor integrated circuit 21 through solder, electrically conductive paste (not depicted), etc. The external parts 22 and 23 are, for example, a resister, a capacitor, an inductor, and so forth. Note that another active component and/or another passive component may be implemented on the first surface 10a of the wiring board 10.

The electronic component 20 is covered with a mold resin 92 formed on the first surface 10a of the wiring board 10. As the mold resin 92, for example, an epoxy-based insulating resin, etc., superior in stiffness may be used. Note that the mold resin 92 may be formed depending on necessity.

For example, the bare chip 30 is flip-chip implemented facedown on a second surface 10b of the wiring board 10 through a gold bump 93.

An external connection electrode 40 is formed on the second surface 10b of the wiring board 10. For example, the external connection electrode 40 is formed of a conductor, such as a copper (Cu), and the film thickness is approximately from 5 μm to 20 μm. The external connection electrode 40 may be used that is obtained by laminating, by plating, nickel (Ni) having a film thickness of approximately 5 μm, palladium (Pa) having a film thickness of approximately 0.2 μm, and gold (Au) having a film thickness of approximately 0.05 μm on copper (Cu) having a film thickness of approximately 5 μm. With this structure, solderability of the external connection electrode 40 is enhanced.

A plane shape of the external connection electrode 40 may be, for example, a circular shape, a square shape, etc. The number and arrangement of the one or more external connection electrodes 40 may be appropriately determined. For example, a plurality of external connection electrodes 40 may be peripherally arranged in the vicinity of the bare chip 30. A solder bump 50 is connected to the external connection electrode 40.

The surface (surface on which a circuit is formed) and the side surface of the bare chip 30 and the side surface of the solder bump 50 are covered with a resin 94 (which includes an under fill resin 95 and a mold resin 96) at the side of the second surface 10b of the wiring board 10.

More specifically, the under fill resin 95 is filled between the surface of the bare chip 30 and the second surface 10b of the wiring board 10 and extends to the vicinity of the bare chip 30 including the side surface of the bare chip 30. As the under fill resin 95, for example, an epoxy-based insulating resin, etc., superior in fluidity may be used.

The mold resin 96, which covers the side surface of the solder bump 50, is provided around the under fill resin 95. As the mold resin 96, for example, an epoxy-based insulating resin, etc., superior in stiffness may be used.

Note that, in FIG. 1, the surface and the side surface of the bare chip 30 is covered with the under fill resin 95, and the side surface of the solder bump 50 is covered with the mold resin 96; however, a part of the bare chip 30 may be directly covered with the mold resin 96.

The reverse surface of the bare chip 30 and a connection surface of the solder bump 50 (the surface to be connected to the circuit board, etc.) are exposed from the resin 94. The reverse surface of the bare chip 30 and the connection surface of the solder bump 50 are on the same plane. The plane shape of the connection surface of the solder bump 50 may be, for example, a circular shape, a square shape, etc. By exposing the reverse surface of the bare chip 30 from the resin 94, a heat dissipating property of the module 1 can be enhanced.

Figure 2:
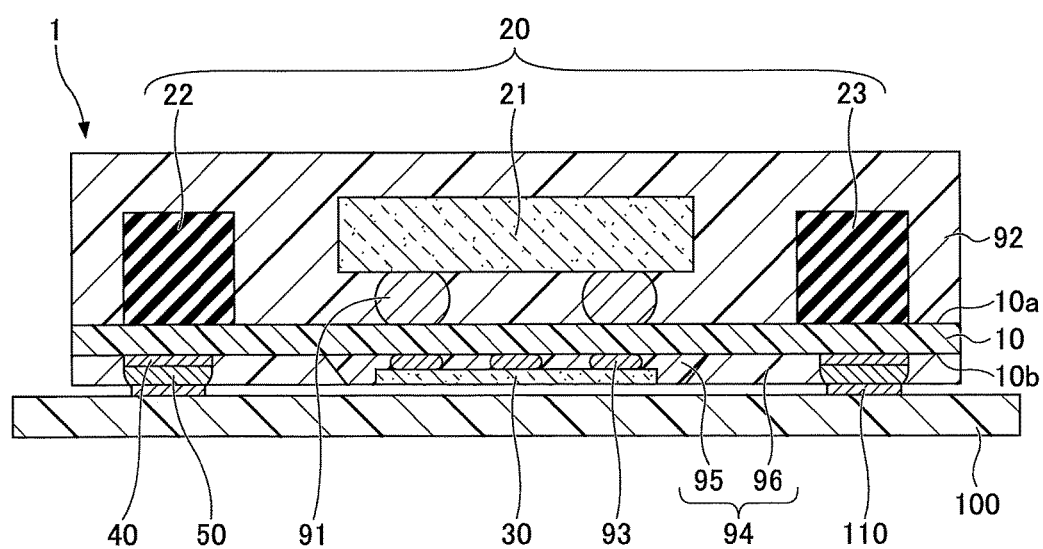
FIG. 2 is a cross-sectional view exemplifying a state in which a module 1 is implemented on a circuit board.

FIG. 2 is a cross-sectional view exemplifying a state in which the module 1 is implemented on the circuit board. Referring to FIG. 2, the module 1 is implemented on the circuit board 100 so that the reverse surface of the bare chip 30 and the connection surface of the solder bump 50 on the second surface 10b of the wiring board 10 face the circuit board 100. At this time, the connection surface of the solder bump 50 is directly bonded or bonded through any other solder, etc., to an electrode 110 of the circuit board 100.

Figure 3:
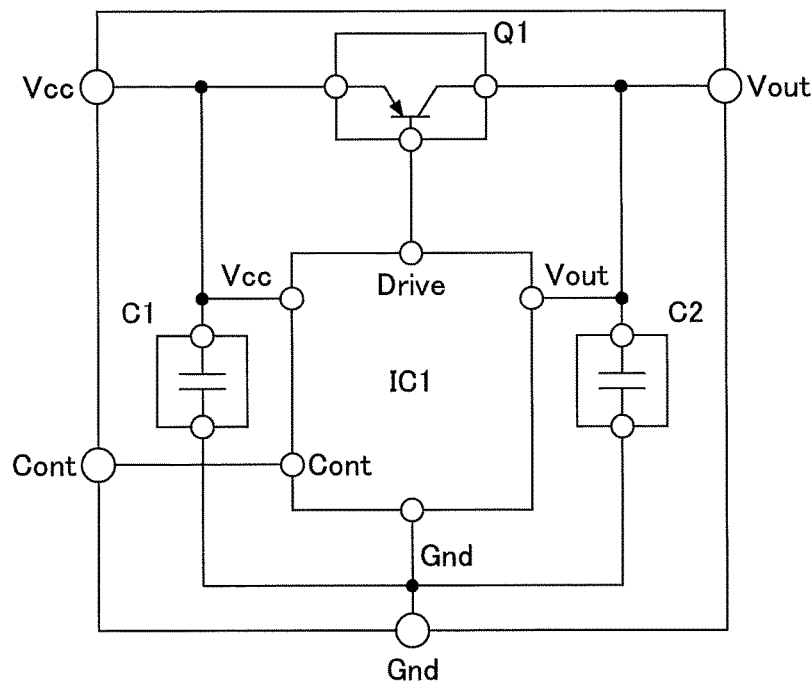
FIG. 3 is a diagram exemplifying a circuit capable of being applied to the module 1.

FIG. 3 is a diagram exemplifying a circuit capable of being applied to the module 1. The module 1 depicted in FIG. 3 is a regulator, which is capable of converting a voltage input to Vcc into a predetermined voltage Vout to output the converted voltage. Note that Cont is a terminal for switching operating/non-operating of the module 1. For example, when Cont is set to 'H,' the module 1 is in a operating state, and when Cont is set to 'L,' the module 1 is in a non-operating state.

In FIG. 3, IC1 is a power control semiconductor integrated circuit, which corresponds to the semiconductor integrated circuit 21 of FIG. 1. Additionally, C1 and C2 are external parts, which correspond to the external parts 22 and 23 of FIG. 1, respectively. Additionally, Q1 is a power control element (e.g., a power transistor), which corresponds to the bare chip 30 of FIG. 1. Additionally, Vcc, Vout, and Gnd correspond to the external connection electrode 40 of FIG. 1.

Next, a manufacturing method of the module 1 is described. FIG. 4 through FIG. 9 are diagrams exemplifying the manufacturing process of the module according to the first embodiment.

Figure 4:
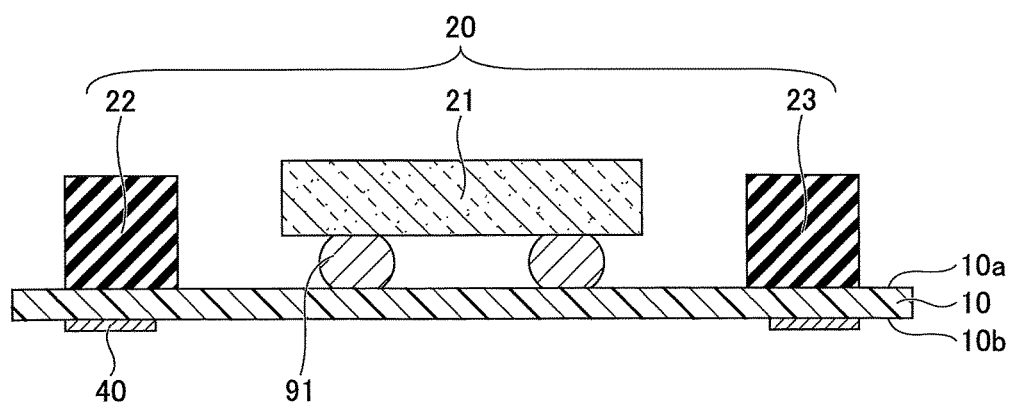
FIG. 4 is a diagram (part 1) exemplifying a manufacturing process of a module according to a first embodiment.

First, in the process depicted in FIG. 4, a wiring board 10 is prepared that is provided with the first surface 10a, the second surface 10b, and the external connection electrode 40 on the second surface 10b; and the electronic component 20 is implemented on the first surface 10a of the wiring board 10.

Specifically, solder, which is to be the solder bump 91, etc., is formed at a predetermined position on the first surface 10a of the wiring board 10 by solder printing, etc.; and the semiconductor integrated circuit 21 and the external parts 22 and 23 are installed at predetermined positions by a chip installation machine. After that, the semiconductor integrated circuit 21 and the external parts 22 and 23 are implemented on the first surface 10a of the wiring board 10 by melting the solder by reflow, etc., and then solidifying the solder. After the implementation, depending on necessity, a flux residue is removed.

Figure 5:
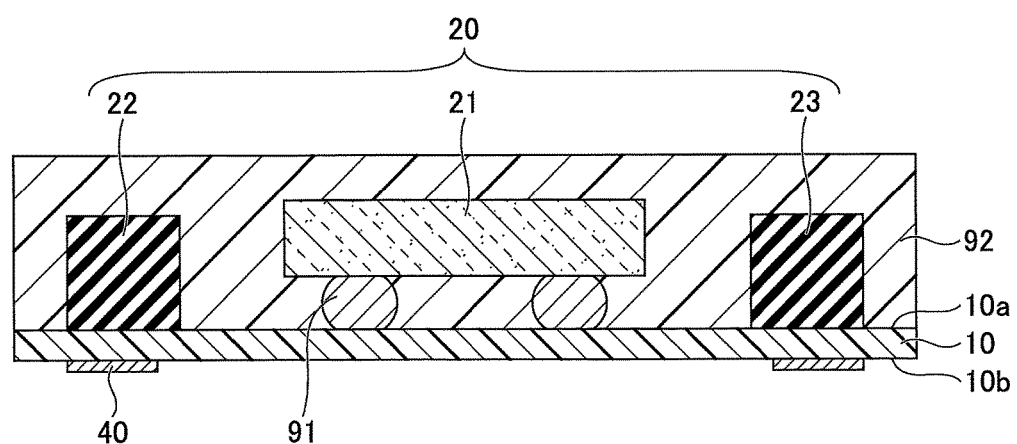
FIG. 5 is a diagram (part 2) exemplifying the manufacturing process of the module according to the first embodiment.

Subsequently, in the process depicted in FIG. 5, the mold resin 92 for covering the electronic component 20 is formed on the first surface 10a of the wiring board 10. Specifically, for example, the mold resin 92 is formed by pouring, by a transfer mold, a compression mold, etc., an epoxy-based insulating resin, etc., superior in stiffness into the first surface 10a of the wiring board 10 so as to cover the electronic component 20, and then solidifying it.

Figure 6:
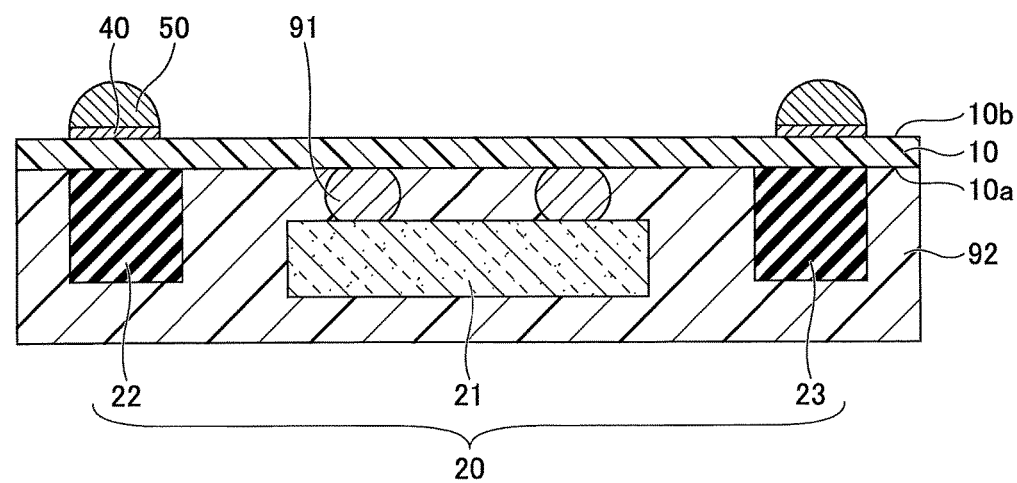
FIG. 6 is a diagram (part 3) exemplifying the manufacturing process of the module according to the first embodiment.

Next, in the process depicted in FIG. 6, the solder bump 50 is formed on the external connection electrode 40 on the second surface 10b of the wiring board 10 by solder printing, ball mounting, etc. For example, the solder bump 50 may be formed to have an approximate hemispherical shape. After that, depending on necessity, a flux residue is removed. Note that, for convenience, FIG. 6 through FIG. 9 are depicted to be vertically inverted with respect to FIG. 4 and FIG. 5.

Figure 7:
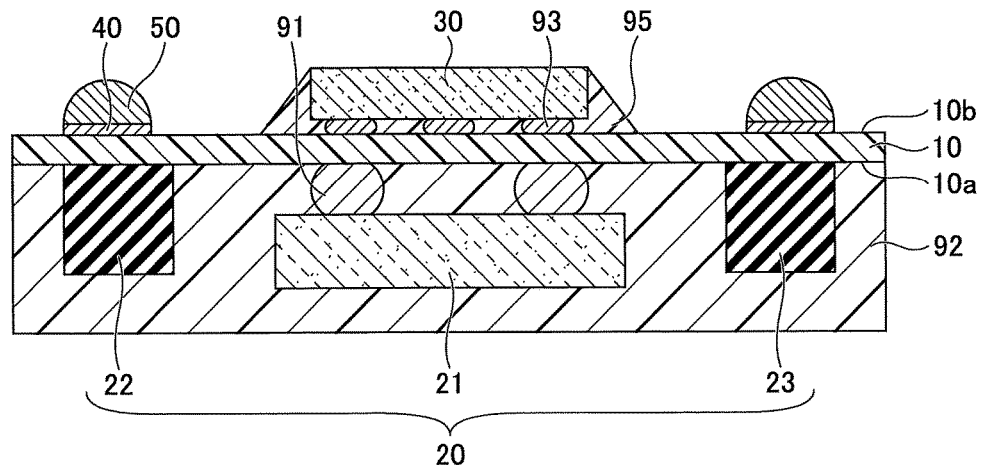
FIG. 7 is a diagram (part 4) exemplifying the manufacturing process of the module according to the first embodiment.

Next, in the process depicted in FIG. 7, the diced bare chip 30 on which the gold bump 93 is formed is prepared, and the bare chip 30 is flip-chip implemented on the second surface 10b of the wiring board 10 while facing downward. Note that, in this process, the thickness of the bare chip 30 is, for example, approximately 200 μm to 300 μm.

After that, an epoxy-based insulating resin, etc., superior in fluidity is filled between the the surface of the bare chip 30 and the second surface 10b of the wiring board 10, and then the under fill resin 95 is formed by solidifying it. The under fill resin 95 extends to the vicinity of the bare chip 30, which includes the side surface of the bare chip 30.

Figure 8:
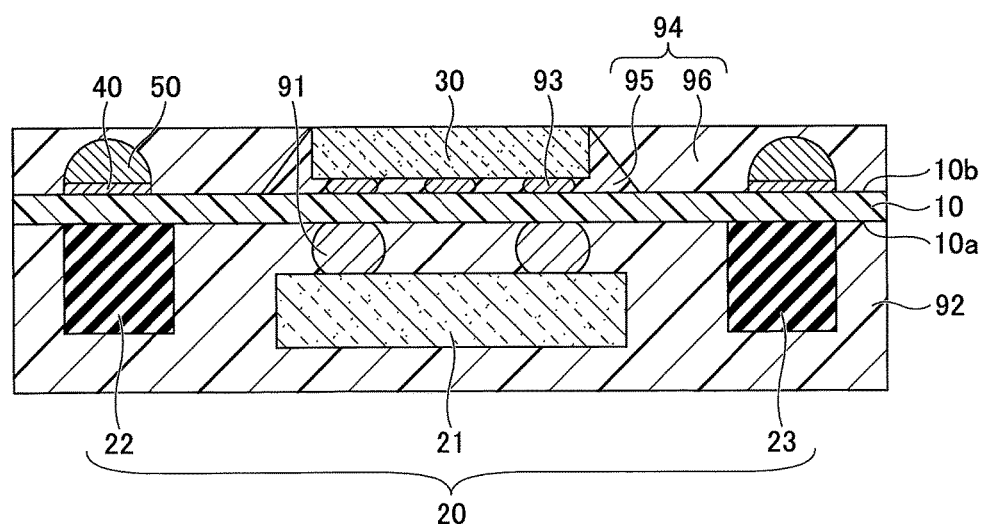
FIG. 8 is a diagram (part 5) exemplifying the manufacturing process of the module according to the first embodiment.

Next, in the process illustrated in FIG. 8, the mold resin 96 for covering the bare chip 30, the under fill resin 95, and the solder bump 50 is formed on the second surface 10b of the wiring board 10. The method for forming the mold resin 96 can be the same as the process depicted in FIG. 5. With this process, the resin 94 including the under fill resin 95 and the mold resin 96 is completed.

Figure 9:
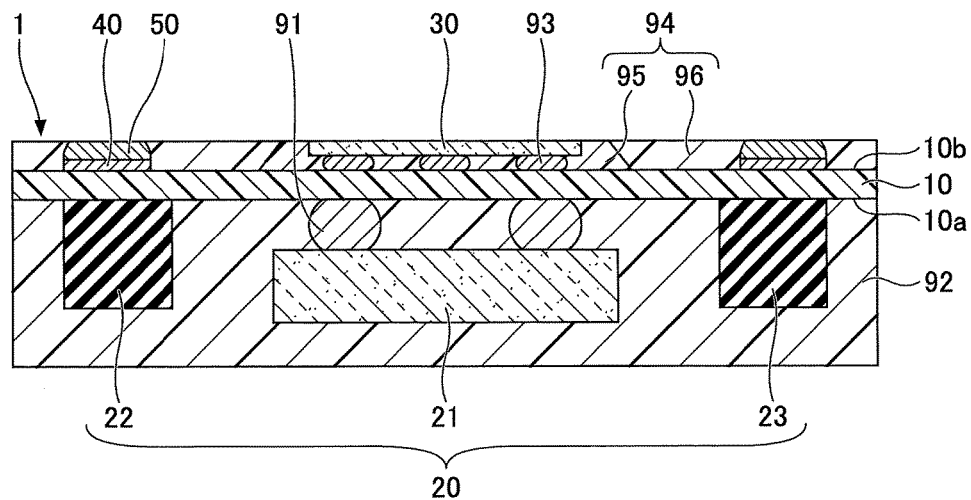
FIG. 9 is a diagram (part 6) exemplifying the manufacturing process of the module according to the first embodiment.

Next, in the process depicted in FIG. 9, on the second surface 10b of the wiring board 10, the bare chip 30, the solder bump 50, and the resin 94 are polished by a predetermined amount using a back grinder, etc. As a result, the reverse surface of the bare chip 30 and the connection surface of the solder bump 50 are exposed on the same plane from the resin 94. The planar shape of the connection surface of the solder bump 50 may be, for example, a circular shape, a square shape, etc. After polishing, the thickness of the bare chip 30 may be, for example, approximately from 40 μm to 60 μm.

After the process of FIG. 9, a process of marking a product lot and a product name, and/or a process of conducting electrical inspection and appearance inspection, etc., may be appropriately provided. By the above-described process, the module 1 depicted in FIG. 1 is completed.

Note that the process of manufacturing a single module 1 is described here; however, from the perspective of production efficiency, the process may preferably be such that a plurality of modules 1 is simultaneously manufactured using a sheet substrate, and dicing is executed at the end. In this case, in each of the areas on the sheet substrate that are to be the respective wiring boards 10, a process similar to the process of FIG. 4 through FIG. 9 is executed, and thereby the aggregated plurality of modules 1 is produced. After that, the aggregated plurality of modules 1 is separated by dicing, etc., and thereby the plurality of modules 1 is manufactured.

As described above, in the module 1 according to the first embodiment, the height of the connection surface of the solder bump 50 formed on the second surface 10b of the wiring board 10 is the same as the height of the reverse surface of the bare chip 30 implemented on the second surface 10b of the wiring board 10. Namely, unlike a usual module, a post electrode with a height that is greater than the height of an electronic component implemented on a wiring board is not used, so that the module 1 can be made thinner compared to a usual module.

Further, for example, when a copper post is used as a post electrode, in addition to an increase in the material cost, a preflux process, etc., for preventing oxidation of the copper post is required and the cost for implementing the copper post is required. As no copper post, etc., is used for the module 1, the price of the module 1 can be lowered compared to usual one.

Further, a method can be considered in which a module is made thinner by providing a cavity structure on a wiring board; however, a special structure is required, and it can lead to an increase in the cost of the module. In the module 1, a special structure, such as the cavity structure, is not required, and the module 1 can be made thinner using commonly used electronic components, and, thus, the price of the module 1 can be lowered compared to usual one.

Further, in the module 1, the heat generation caused by operation of the module 1 can be reduced because the heat dissipation efficiency is enhanced by exposing the reverse surface of the bare chip 30 from the resin 94.

Modified Example 1 of the First Embodiment

In the modified example 1 of the first embodiment, an example is described in which the solder bump is formed on the second surface 10b of the wiring board 10. Note that, in the modified example 1 of the first embodiment, the description of a component that is identical to that of the above-described embodiment may be omitted.

Figure 10:
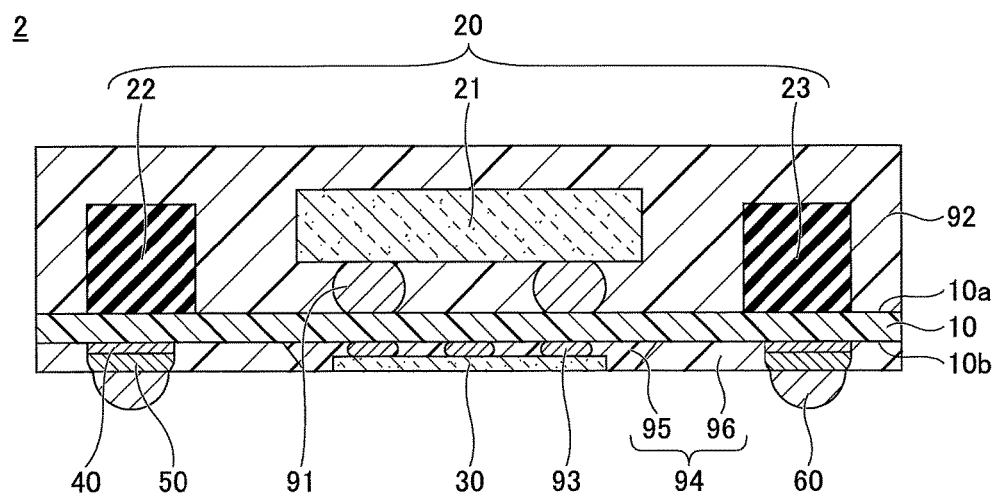
FIG. 10 is a cross-sectional view exemplifying a module according to a modified example 1 of the first embodiment.

FIG. 10 is a cross-sectional view exemplifying a module according to the modified example 1 of the first embodiment. Referring to FIG. 10, a module 2 according to the modified example 1 of the first embodiment differs from the module 1 (cf., FIG. 1) in that an additional solder bump 60 is formed on the connection surface of the solder bump 50. The solder bump 60 can be formed, for example, by a method similar to that of the solder bump 50.

As described above, by further forming the solder bump 60 on the connection surface of the solder bump 50, it can be handled similar to a usual CSP (Chip Scale Package).

Modified Example 2 of the First Embodiment

In the modified example 2 of the first embodiment, an example is described in which a metal film is formed on the reverse surface of the bare chip 30. Note that, in the modified example 2 of the first embodiment, the description of a component that is the same as that of the above-described embodiments may be omitted.

Figure 11:
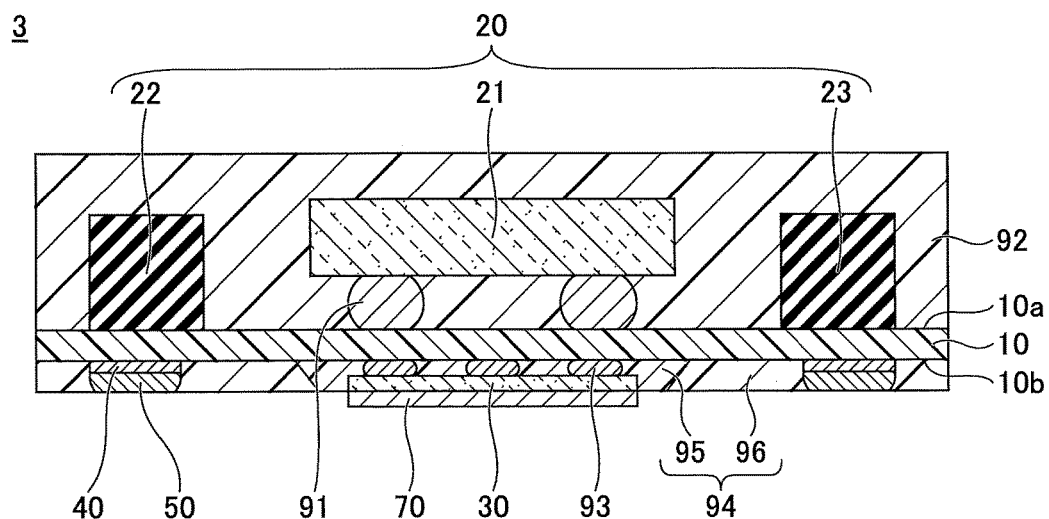
FIG. 11 is a cross-sectional view exemplifying a module according to a modified example 2 of the first embodiment.

FIG. 11 is a cross-sectional view exemplifying a module according to the modified example 2 of the first embodiment. Referring to FIG. 11, a module 3 according to the modified example 2 of the first embodiment differs from the module 1 (cf., FIG. 1) in that a metal film 70 is formed on the reverse surface of the bare chip 30. After the process of polishing the resin 94, etc., the metal film 70 can be formed on the reverse surface of the bare chip 30, for example, by a sputtering method, a vacuum evaporation method, etc. As the material of the metal film 70, for example, copper (Cu), aluminum (Al), etc., may be used.

As described above, by forming the metal film 70 on the reverse surface of the bare chip 30, the heat dissipation efficiency can further be enhanced. During implementation of the module 3 on the circuit board 100, etc., it is more effective for enhancing the heat dissipation effect to bond the metal film 70 by a solid pattern, such as the circuit board 100, and solder, etc., because the heat of the module 3 escapes toward the solid pattern, such as the circuit board 100.

Modified Example 3 of the First Embodiment

In the modified example 3 of the first embodiment, an example is described in which the structure on the first surface 10a and the structure on the second surface 10b of the wiring board 10 are approximately the same. Note that, in the modified example 3 of the first embodiment, the description of a component that is identical to that of the above-described embodiments may be omitted.

Figure 12:
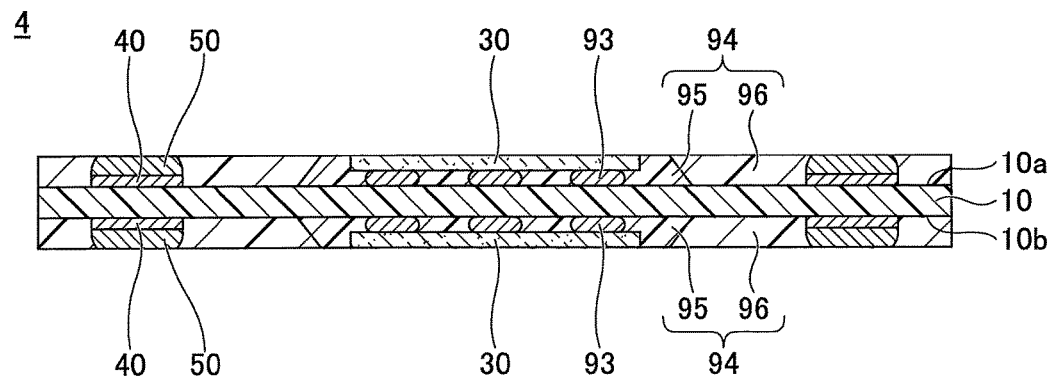
FIG. 12 is a cross-sectional view exemplifying a module according to a modified example 3 of the first embodiment.

FIG. 12 is a cross-sectional view exemplifying a module according to the modified example 3 of the first embodiment. Referring to FIG. 12, a module 4 according to the modified example 3 of the first embodiment differs from the module 1 (cf., FIG. 1) in that the structure on the first surface 10a and the structure on the second surface 10b of the wiring board 10 are approximately the same. Namely, a bare chip 30, an external connection electrode 40, and a solder bump 50, etc., are formed on the first surface 10a of the wiring board 10. Note that, though the depiction is omitted, external parts (which correspond to the external parts 22 and 23 of FIG. 1) of the bare chip 30 on the first surface 10a are implemented on the first surface 10a of the wiring board 10.

As described above, the structure on the first surface 10a and the structure on the second surface 10b of the wiring board 10 may be approximately the same. In this case, the module 4 can be made even thinner because the bare chip 30 and so forth are polished on the first surface 10a and on the second surface 10b of the wiring board 10.

Modified Example 4 of the First Embodiment

In the modified example 4 of the first embodiment, an example of a stack structure is described. Note that, in the modified example 4 of the first embodiment, the description of a component that is the same as that of the above-described embodiments may be omitted.

Figure 13:
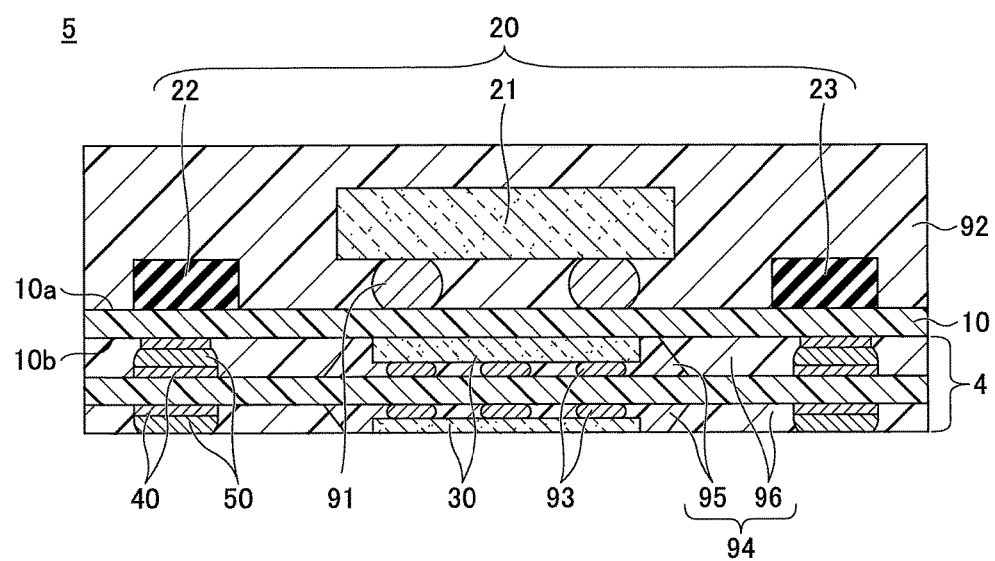
FIG. 13 is a cross-sectional view exemplifying a module according to a fourth example of the first embodiment.

FIG. 13 is a cross-sectional view exemplifying a module according to the modified example 4 of the first embodiment. Referring to FIG. 13, a module 5 according to the modified example 4 of the first embodiment is obtained by forming a structure that is the same as the structure on the first surface 10a of the wiring board 10 of the module 1 on the module 4 depicted in FIG. 12 through the wiring board 10.

As described above, the structure may be such that the modules 1 through 4 are appropriately stacked. In this case, a module provided with a more complicated function compared to that of FIG. 3 can be achieved.

The preferred embodiment and the modified examples are described above. However, the present invention is not limited to the above-described embodiment and the modified examples. Various modifications and substitutions may be added to the above-described embodiment and the modified examples without departing from the scope described in the claims.

For example, in the manufacturing process of the module 1, implementation of a component may be started from any one of the first surface 10a and the second surface 10b of the wiring board 10. Additionally, any one of the mold resin 92 and the mold resin 96 may be formed first; or the mold resins 92 and 96 may be simultaneously formed after completion of the implementation on both surfaces of the wiring board 10 (molding may be made on both surfaces at once).

The present international application is based on and claims the benefit of priority of Japanese Patent Application No. 2015-169523 filed on Aug. 28, 2015; the entire contents of Japanese Patent Application No. 2015-169523 are incorporated herein by reference.

DESCRIPTION OF THE REFERENCE NUMERALS 1, 2, 3, 4, 5: module
10: wiring board
10a: first surface of wiring board
10b: second surface of wiring board
20: electronic component
21: semiconductor integrated circuit
22, 23: external part
30: bare chip
40: external connection electrode
50, 60, 91: solder bump
70: metal film
92, 96: mold resin
93: gold bump
94: resin
95: under fill resin
100: circuit board
110: electrode

The invention claimed is:

1. A module implemented on a circuit board, the module comprising:
a wiring board;
an electronic component implemented on a first surface of the wiring board;
an external connection electrode formed on a second surface of the wiring board;
a solder bump connected to the external connection electrode;
a bare chip implemented facedown on the second surface of the wiring board; and
a resin covering a surface and a side surface of the bare chip and a side surface of the solder bump on the second surface of the wiring board,
wherein a reverse surface of the bare chip and a connection surface of the solder bump are exposed from the resin such that the reverse surface of the bare chip and the connection surface of the solder bump are in a same plane,
wherein the module is implemented on the circuit board so that the reverse surface of the bare chip and the connection surface of the solder bump face the circuit board, and
wherein a metal film is formed on the reverse surface of the bare chip.

2. The module according to claim 1, wherein the electronic component includes a semiconductor integrated circuit and an external part of the semiconductor integrated circuit.

3. The module according to claim 2, wherein the semiconductor integrated circuit is a power control semiconductor integrated circuit, and the bare chip is a power control element.

4. A manufacturing method of a module implemented on a circuit board, the method comprising:
preparing a wiring board having a first surface, a second surface, and an external connection electrode on the second surface;
implementing an electronic component on the first surface of the wiring board;
forming a solder bump on the external connection electrode;
implementing a bare chip facedown on the second surface of the wiring board;
covering the bare chip and the solder bump with a resin;
polishing the resin so that a reverse surface of the bare chip and a connection surface of the solder bump are exposed; and
forming a metal film on the reverse surface of the bare chip after the polishing of the resin.

5. The manufacturing method of the module according to claim 4, wherein the electronic component includes a semiconductor integrated circuit and an external part of the semiconductor integrated circuit.

6. The manufacturing method of the module according to claim 5, wherein the semiconductor integrated circuit is a power control semiconductor integrated circuit, and the bare chip is a power control element.

* * * * *